(12) United States Patent
Poulakis

(10) Patent No.: US 8,518,517 B2
(45) Date of Patent: Aug. 27, 2013

(54) HOOK AND LOOP FASTENER ELEMENT

(75) Inventor: Konstantinos Poulakis, Hildrizhausen (DE)

(73) Assignee: Gottlieb Binder GmbH & Co. KG, Holzgerlingen (DE)

( * ) Notice: Subject to any disclaimer, the term of this patent is extended or adjusted under 35 U.S.C. 154(b) by 196 days.

(21) Appl. No.: 13/138,599

(22) PCT Filed: Apr. 29, 2010

(86) PCT No.: PCT/EP2010/002633
§ 371 (c)(1),
(2), (4) Date: Sep. 9, 2011

(87) PCT Pub. No.: WO2010/130338
PCT Pub. Date: Nov. 18, 2010

(65) Prior Publication Data
US 2012/0027987 A1    Feb. 2, 2012

(30) Foreign Application Priority Data
May 13, 2009 (DE) .......................... 10 2009 020 944

(51) Int. Cl.
*A44B 18/00* (2006.01)

(52) U.S. Cl.
USPC ................................ 428/100; 428/99; 24/442

(58) Field of Classification Search
USPC ...................................... 428/100, 99; 24/442
See application file for complete search history.

(56) References Cited

FOREIGN PATENT DOCUMENTS

| | | |
|---|---|---|
| DE | 197 03 390 | 5/1998 |
| DE | 101 05 089 | 8/2002 |
| DE | 10 2004 042 397 | 11/2005 |
| DE | 10 2006 039 134 | 3/2008 |
| WO | WO 2005-025362 | 3/2005 |

*Primary Examiner* — Alexander Thomas
(74) *Attorney, Agent, or Firm* — Roylance, Abrams, Berdo & Goodman LLP

(57) ABSTRACT

The invention relates to a hook and loop fastener element having an electrically non-conductive carrier (4), preferably made of a plastic material, defining a gripping surface (6) from which gripping elements (8) extend that can engage with counter-elements for forming a hook and loop closure, at least one electrical conductor (14) being present within the gripping surface (6), characterized in that the carrier is provided in the form of a carrier band defining a longitudinal axis, and that said band is wrapped by the at least one conductor over at least part of the length thereof.

12 Claims, 2 Drawing Sheets

HOOK AND LOOP FASTENER ELEMENT

Figure 1:
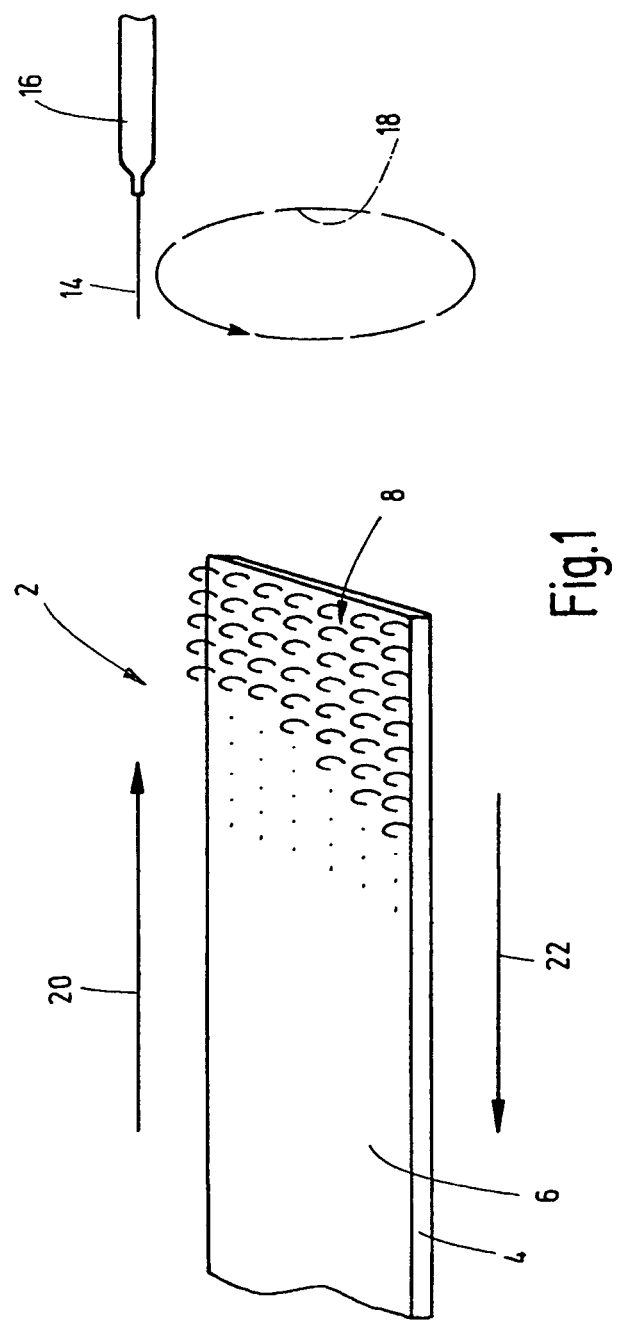

The invention relates to a hook and loop fastener element with an electrically non-conductive substrate, preferably made of a synthetic plastic material, defining an adhesive area, from which extend adhesive elements that can interlock with counter-elements in order to form a hook and loop close fastener, at least one electrical conductor wire being present inside the adhesive area.

A generic touch and closure fastener element is disclosed in DE 10 2006 039 134 A1, which proposes an electrical contact arrangement comprising a hook and loop connection, which has an electrically conductive surface. The contact arrangement comprises at least two contact elements, each of which has a flexible substrate tape that exhibits a contact area with hook and loop structures that can be interlocked to form the hook and loop connection and produce an electrical connection without a great deal of technical complexity. A conductor strip is arranged in a supply area of each substrate tape, which lies preferably on the main surface of the respective substrate tape, on which the contact area with the hook and loop structures is also disposed, and this substrate tape is preferably free of hook and loop structures. The hook and loop structures of two substrate tapes are made of a metal wire so as to be complementary to each other—as hooks and loops—and mesh on making contact with each other. As an alternative, the hook and loop structures comprise a thin synthetic plastic fiber having a metal-coated surface.

WO 2005/025362 A1 relates to an additional electrically conductive hook and loop fastener, based on conductive polymers. The hook and loop fastener contains conductive polymers and/or plastic composites that are filled with conductive materials. Highly conductive polymers, such as poly-(3,4-)ethylenedioxythiophene (PEDOT) and polyaniline (PANI), are economical and lend themselves well to use in a hook and loop fastener. For production purposes, the materials either can be drawn as fibers and woven into a hook and loop fastener or can be applied as a surface coating on other polymers and, thus, directly on the two parts of the hook and loop fastener.

DE 10 2004 042 397 A1 relates to an electrically conductive textile contact connection comprising a first and a second electrically conductive textile fabric section. In this case, a first electrically conductive contact surface, which is integrated or fastened to the first textile surface, is detachably connected to a second textile surface and to a second electrically conductive contact surface, which is integrated or fastened on said second textile surface. A textile application is, for example, a strip of material on which there is printed a line of text; and the underside of this strip of material has hook and loop surfaces into which the contact pads of conductive fabric are integrated. On the complementary side of a textile web, such as a section of a piece of clothing, a row of additional electrically conductive contact pads is fastened in the hook and loop nonwoven. During production of the hook and loop connection between the hook and loop surfaces of the strip of material and the hook and loop nonwovens of the textile web, an electrically conductive connection between the contact pads is produced by pressing together the hook and loop surfaces and the hook and loop nonwovens.

DE 101 05 089 A1 discloses an electrical conductor, having a flat cross section, which has electrically conductive material that is embedded in an electrically insulating material provided with hooks or loops. At least one outer side of the electrically insulating material has the hooks or loops of a hook and loop type fastener. On the basis of this formation, such electrical conductors can be fastened to the assembly surfaces provided therefor, in particular to interior trim of motor vehicles having textile-like surfaces, by means of a hook and loop type connection. Thus adhesive bonds are being replaced by durable hook and loop connections. To this end, a common hook and loop fastener tape can be used as the insulating material. If both outer sides of the electrical conductor have hooks and/or loops, then said conductor can be fastened on both sides to appropriately formed interior trims or functional areas. The electrical conductor can be a flexible flat cable or a flexible printed circuit.

As an essential component of touch-and-close fasteners, which are generally known under the trade mark "Kletten," such touch-and-close fastener elements have a commensurate plurality of adhesive elements that form, with the stem-like base parts, the head-side fastener bodies, which are preferably integrally connected to the substrate. These fastener bodies may have the shape of mushroom heads, hooks, or loops. In this case, the adhesive elements having stem lengths, which are often less than 1 mm, are distributed in a pattern arrangement exhibiting dense packing so that the interlocking bodies projecting beyond the substrate are arranged so as to be spaced apart from each other at such a distance that the result is an interlocking engagement with the counter-elements of another touch-and-close fastener element so as to complete the touch and close fastening.

Due to the wide range of possible applications and uses for which the touch-and-close fasteners can be used advantageously, there are often situations in which the touch-and-close fasteners are a component of systems that are made of synthetic materials. They may include, for example, textile structures comprising synthetic fibers or support structures made of a synthetic plastic material or the like. Under certain conditions, the electrically insulating properties of such materials may induce an electrostatic charge with the associated negative effects, like an adverse effect on the physical comfort of the persons handling such fasteners or a fault in the electronic systems due to discharges or electric fields.

In light of this problem, the object of the invention is to provide a touch-and-close fastener element that counteracts the harmful effects of the formation of an electrical potential, although it has an electrically non-conductive substrate, and is easy to manufacture.

The invention achieves this object with a touch-and-close fastener element which has the features of claim 1 in its entirety.

According to the characterizing part of claim 1, the invention provides a substrate in the form of a substrate tape defining a longitudinal direction, and said substrate tape is wrapped over at least one part of its length by the at least one conductor wire. At the same time, the production is made especially easy by means of a winding process.

The interior of the adhesive area of the substrate made of an electrically non-conductive material has at least one electrical conductor. Therefore, a means for influencing the electrical or electrostatic states is provided, for example, for dissipating the electrostatic charges, despite a system constructed of insulating materials.

When configuring the windings in a way that a conductor wire, which is continuous over the substrate tape, is wound into windings without crossing, such a winding can be used not only advantageously for dissipating the electrostatic charges, but can also form an electrical conductor for a current flow, which is generated by an external device, for example, as a control line for control functions or as a heat resistor. The possibility of warming or heating touch-and-close fasteners can be especially advantageous when the respective touch-and-close fasteners are used, for example, in performance clothing for persons who are exposed to extreme climate conditions. In this context, it may be advantageous to prevent the touch and closure fasteners from freezing. For this purpose, steps may be taken to provide a corresponding conductor with PTC [positive temperature coefficient] conductor components that enable, as well-known, an automatic temperature control.

In a preferred embodiment of the touch-and-close fastener element according to the invention, the at least one conductor wire in a winding layer is arranged without crossing in a continuous manner on the substrate tape. Furthermore, it is advantageous that the at least one conductor wire runs from one end to the other end of the substrate tape.

In an additional preferred embodiment of the touch-and-close fastener element according to the invention, a wire pattern of intersecting wire sections is formed by wrapping the at least one conductor wire around the substrate tape so as to form at least two winding layers. A wire pattern of intersecting wire sections can be formed by wrapping the conductor wire around the substrate tape so as to form two winding layers; and said winding layers slope toward the longitudinal axis of the substrate tape in the direction of pitch reversed to each other. A wire net exhibiting such crossings lends itself especially well to dissipating electrostatic charges.

Working on this basis, the arrangement can be configured in such a way that the two winding layers are formed at mutually opposite, identical pitch angles, so that the wire sections cross one another in each case in a centered manner on the adhesive area and the back side of the substrate tape, so that a regular conductor pattern is formed.

In order to provide with a relatively small number of winding turns a corresponding longitudinal region of the substrate tape with conductor strips, it can be advantageous that the windings on the front adhesive area and on the back side of the substrate tape run relative to its longitudinal axis at a pitch angle that is at least 10 angular degrees.

The conditions for dissipating charges are especially favorable if an electrically conductive network is formed inside the adhesive area in such a way that the conductor strips are available in an arrangement that is distributed over the surface.

In this case, the arrangement can be configured in such an advantageous way that the network has at least one conductor wire that extends along the adhesive area in abutment on the adhesive elements. The substrate is made preferably of a synthetic plastic material.

The arrangement can be configured in such an advantageous manner that the back side of the substrate tape has a layer of adhesive that is superposed on the wire conductor. Thus, the touch-and-close fastener element can be secured on the assigned structural element not only in an especially simple way, but at the same time the layer of adhesive can be used to secure or can help to secure the conductor wire windings.

In an analogous manner, as is often also the case with touch-and-close fastener elements without electrically conducting mechanisms, the layer of adhesive can have a cover strip, which can be peeled off in order to attach the touch-and-close fastener element to a respective structural element.

The invention is explained in detail below by means of an exemplary embodiment that is depicted in the drawings.

Figure 2:
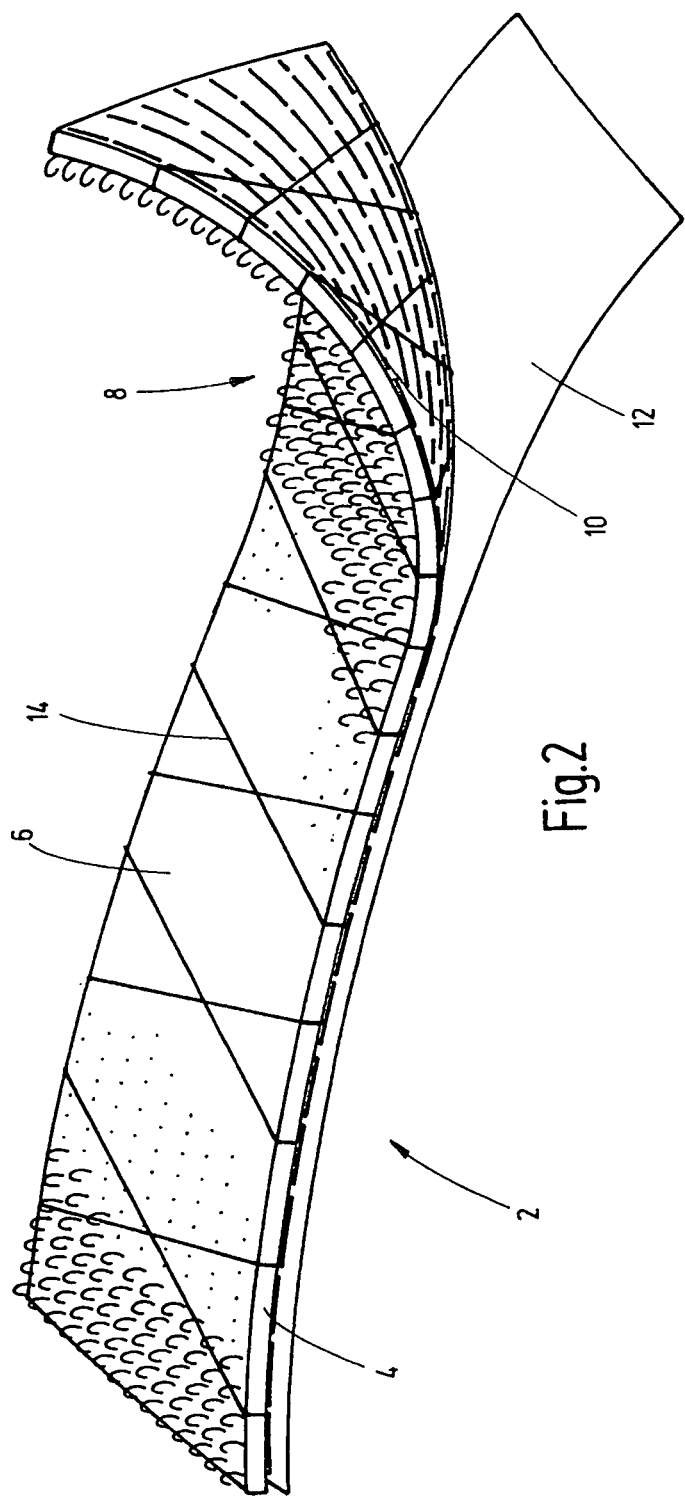

FIG. 1 is a highly simplified representation drawn only as a function-oriented diagram for a better understanding of the production process for an exemplary embodiment of the touch-and-close fastener element according to the invention; and FIG. 2 is a perspective oblique view of the embodiment of the touch-and-close fastener element, which is drawn on a scale that is approximately twice the size of a practical embodiment, wherein the adhesive elements are shown only schematically; and a cover strip is shown in the partially removed state.

The drawing shows an exemplary embodiment of the inventive touch-and-close fastener element, which is designated as a whole as 2, with only a portion of its longitudinal section being shown in FIG. 1. As is apparent from FIG. 2, the touch-and-close fastener element 2 consists of multiple layers, comprising a substrate tape 4, which is made of a readily extrudable synthetic plastic material and has an adhesive area 6 from which adhesive elements 8 project. These adhesive elements are shown highly simplified by means of just a diagram and are indicated to some extent as tiny hooks. In such touch-and-close fastener elements 2, the adhesive elements 8 typically exhibit stem-like base members, which are connected to the substrate tape 4, and form on the head side interlocking bodies, for example, in the form of mushroom heads, hooks, or loops. In a manner that is conventional for such plastic touch-and-close fastener elements, the adhesive elements 8 may have a fine structure and protrude less than 1 mm over the adhesive area 6 and have a packing density of several $100/cm^2$. As shown in FIG. 2, a layer of adhesive 10 is applied on the back side of the substrate tape 4 opposite the adhesive area 6. This layer of adhesive is covered by a cover strip 12 which is made of a material that can be easily removed by peeling from the layer of adhesive 10 when the touch-and-close fastener element 2 is to be glued to the structural element concerned.

In the present embodiment, a thin conductor wire 14 is laid, as shown in FIG. 2, around the touch-and-close fastener element 2 in such a way that it extends with straight winding sections over the adhesive area 6 and over the back side of the substrate tape 4, so that the winding sections on the adhesive area 6 extend partially through gaps between the adhesive elements 8. In the illustrated example, there are two winding layers, the pitch angle with respect to the longitudinal direction of the substrate tape 4 being several angular degrees, so that the winding sections on the adhesive area 6 and on the back side are spaced further apart, as shown in FIG. 2. Thus, the winding sections of the winding layers extend in such a way that the winding sections of the one winding layer slope toward the one side relative to the longitudinal direction of the substrate tape 4, whereas the winding sections of the second winding layer have an opposite slope relative to the longitudinal direction. The pitch angles are selected so as to be the same in size opposite to each other, so that in each case the winding sections cross in a centered manner in the substrate tape 4. This feature makes it possible to construct a conductive network in which the winding sections form a pattern in which the conductors run in an X-shaped pattern when viewed from the top.

The production can be carried out by means of a winding process as shown by the schematic diagram in FIG. 1. In order to attain a substrate tape section, as depicted in FIG. 2, a wire dispensing unit 16 can be provided that guides the issuing wire 14 in circular winding motions, shown by the rotary arrow 18, so that when the section of substrate tape 4 that is to be wrapped is moved in the direction shown by the directional arrow 20 in FIG. 1, the entire length of the section of the substrate tape 4, shown in FIG. 2, is wrapped. If only one winding layer is to be formed, so that without forming an X-shape the conductor wire 14 extends over the length of the substrate tape 4 without crossing, and so that the sections on the adhesive area 6 and on the back side extend so as to run parallel to each other and in the same direction of pitch, the winding process is terminated. If, however, the second winding layer, shown in FIG. 2, is to be wound so as to form an X-shaped crossing, then the winding process is continued during the reverse motion according to the directional arrow 22.

In both cases, the conductor arrangement, formed on the substrate tape 4, makes contact preferably with one and/or the other end of the winding and/or windings. This type of contacting is easier to make, for example, on the back side of the substrate tape 4, because when the layer of adhesive 10 is applied on the back side of the substrate tape 4 after carrying out the winding process, the winding sections are embedded more or less in the layer of adhesive and are less well exposed for contacting purposes. Embedding the winding sections in the layer of adhesive 10 also advantageously provides a convenient way to secure the windings.

If the conductor wire 14 in a respective embodiment is not to be used predominantly for dissipating electrostatic charges, but rather, instead or in addition, is to be used as a current carrying conductor for control or heating purposes, then it is advantageous to provide only one continuous winding layer of the conductor wire 14 from one end to the other end of the substrate tape 4 without any crossings. If, on the other hand, primarily the electrostatic charges are to be dissipated, then a winding pattern as shown in FIG. 2, where the conductor wires 14 cross in an X-shaped pattern, is especially advantageous.

In the formation of the winding pattern, a fine conductor wire is preferably used; and the winding process is configured in such a way that the conductor wire 14 on the adhesive area 6 of the substrate tape 4 extends so as to lie flush along the stems of the adhesive elements 8, so that the adhesive elements 8 remain free in their head region; and the interlocking bodies in the form of mushroom heads, hooks, or loops or also in the form of a mixture of interlocking bodies in the form of loops, hooks, and mushrooms heads, are free and unimpeded for the interlocking engagement with the adhesive elements of the counter-element of the conductor wire 14. Thus, the winding layers are protected against displacement by the layer of adhesive 10 not only on the back side of the substrate tape 4, but also protected against displacement on the adhesive area 6 by running in the gaps between the stems of the adhesive elements 8.

The invention claimed is:

1. A hook and loop fastener element with an electrically non-conductive substrate (4), which defines an adhesive area (6), from which extend the adhesive elements (8) that can interlock with counter-elements in order to form a hook and loop fastener, at least one electrical conductor wire (14) being present inside the adhesive area (6), characterized in that the substrate is provided in the form of a substrate tape (4) defining a longitudinal direction, and that said substrate tape is wrapped over at least one part of its length by the at least one conductor wire (14).

2. The touch-and-close fastener element according to claim 1, characterized in that the at least one conductor wire (14) in a winding layer is arranged without crossing in a continuous manner on the substrate tape (4).

3. The touch-and-close fastener element according to claim 2, characterized in that the windings on the front adhesive area (6) and on the back side of the substrate tape (4) run relative to the longitudinal axis at a pitch angle that is at least 10 angular degrees.

4. The touch-and-close fastener element according to claim 1, characterized in that the at least one conductor wire (14) runs from one end to the other end of the substrate tape (4).

5. The touch-and-close fastener element according to claim 1, characterized in that a wire pattern of crossing wire sections is formed in that the at least one conductor wire (14) is wrapped around the substrate tape (4) so as to form at least two winding layers.

6. The touch-and-close fastener element according to claim 5, characterized in that the winding layers slope toward the longitudinal axis of the substrate tape (4) in the direction of pitch reversed to each other.

7. The touch-and-close fastener element according to claim 6, characterized in that both winding layers are formed at mutually opposite, identical pitch angles, so that in each case the wire sections cross one another in a centered manner on the adhesive area (6) and the back side of the substrate tape (4).

8. The touch-and-close fastener element according to claim 5, characterized in that an electrically conductive network (14) is formed inside the adhesive area (6).

9. The touch-and-close fastener element according to claim 1, characterized in that the at least one conductor wire (14) extends along the adhesive area (6) in abutment on the adhesive elements (8).

10. The touch-and-close fastener element according to claim 1, characterized in that the substrate (4) is made of a synthetic plastic material.

11. The touch-and-close fastener element according to claim 1, characterized in that the back side of the substrate tape (4) has a layer of adhesive (10) that is superposed on the at least one conductor wire (14).

12. The touch-and-close fastener element according to claim 11, characterized in that the layer of adhesive (10) has a cover strip (12), which can be peeled off in order to attach the touch-and-close fastener element (2) to a structural element.

* * * * *